(12) United States Patent
Um

(10) Patent No.: US 7,326,438 B2
(45) Date of Patent: Feb. 5, 2008

(54) METHOD FOR DEPOSITING NITRIDE FILM USING CHEMICAL VAPOR DEPOSITION APPARATUS OF SINGLE CHAMBER TYPE

(75) Inventor: Pyung-Yong Um, Hwa sung-si (KR)

(73) Assignee: Eugene Technology Co., Ltd. (KR)

( * ) Notice: Subject to any disclaimer, the term of this patent is extended or adjusted under 35 U.S.C. 154(b) by 0 days.

(21) Appl. No.: 10/529,535

(22) PCT Filed: Sep. 19, 2003

(86) PCT No.: PCT/KR03/01915

§ 371 (c)(1),
(2), (4) Date: Mar. 29, 2005

(87) PCT Pub. No.: WO2004/030059

PCT Pub. Date: Apr. 8, 2004

(65) Prior Publication Data

US 2006/0165889 A1    Jul. 27, 2006

(30) Foreign Application Priority Data

Sep. 30, 2002    (KR) .................. 10-2002-0059372

(51) Int. Cl.
*C23C 16/34* (2006.01)
(52) U.S. Cl. .............................. 427/255.394; 427/255.7

(58) Field of Classification Search .................... None
See application file for complete search history.

(56) References Cited

U.S. PATENT DOCUMENTS

| 4,721,631 | A  | * | 1/1988  | Endo et al. ................... 427/66 |
| 5,399,387 | A  | * | 3/1995  | Law et al. ................... 427/574 |
| 6,224,950 | B1 | * | 5/2001  | Hirata ........................ 427/535 |
| 6,632,750 | B2 | * | 10/2003 | Sato et al. ................. 438/791 |
| 2002/0061659 | A1 | * | 5/2002 | Abe ............................ 438/791 |

FOREIGN PATENT DOCUMENTS

JP        02-137325        5/1990

\* cited by examiner

*Primary Examiner*—Bret Chen
(74) *Attorney, Agent, or Firm*—Hayes Soloway P.C.

(57) ABSTRACT

The present invention relates to a method for depositing a nitride film using a chemical vapor deposition apparatus of single chamber type, and more particularly to a method for depositing a nitride film that is capable of depositing the nitride film in which an area of the nitride film at the top of an interlayer isolation film has a larger thickness compared to each area thereof at the sides and the bottom of the interlayer isolation film and/or a contact hole by regulating a mixture ratio of an ammonia gas and a silane gas, both of which being process gases, using a chemical vapor deposition apparatus of single chamber type.

5 Claims, 6 Drawing Sheets

METHOD FOR DEPOSITING NITRIDE FILM USING CHEMICAL VAPOR DEPOSITION APPARATUS OF SINGLE CHAMBER TYPE

TECHNICAL FIELD

The present invention relates to a method for depositing a nitride film using a chemical vapor deposition apparatus of single chamber type, and more particularly to a method for depositing a nitride film that is capable of depositing the nitride film with a different thickness for each region of the nitride film using one chemical vapor deposition apparatus of single chamber type.

BACKGROUND ART

Generally, a semiconductor device is completed by forming various pattern regions, such as a device separation film, an interlayer isolation film, an electric conduction film, a contact, etc. on a surface of a semiconductor substrate. The interlayer isolation film is formed of a silicon oxidation film or a nitride film (SixNy) such as a PSG (Phosphorus Silicon Glass), a BPSG (Boron Phosphorus Silicon Glass), an USG (Undoped Silicon Glass), etc. Here, the nitride film serves as an interlayer isolation film. In addition, the nitride film may be used as an etching stopper film in an etching process, a barrier film for preventing any damage of a lower film in a chemical mechanical polishing (CMP) process, a barrier film in formation of a minute pattern such as a self-aligned contact, or a material film for performing a variety of functions, such as an oxygen diffusion prevention film for preventing any diffusion of oxygen into a semiconductor substrate in a device separation process.

Moreover, in manufacturing a DRAM (Dynamic Random Access Memory) device with a property of data volatility, a metal being a low resistance material is used as material of word and bit lines to comply a minute patterning trend due to a reduced design rule and to further improve read/write rates for data, instead of a conventional tungsten silicide or a doped silicon. To prevent heavy metal contamination and thermal transformation of a metal material, which are caused by such a change, it is subject to a low thermal bundle process. Even in this process, the nitride film is used as a barrier film.

Such a nitride film is generally deposited by a thermal CVD (chemical vapor deposition) process using a CVD apparatus of furnace type or by a PECVD (Plasma enhanced CVD) process using a plasma enhanced CVD apparatus of single chamber type.

At this time, In case of forming the nitride film using the thermal CVD apparatus, there is an advantage in that a loading effect and a surface roughness characteristic are excellent, resulting in a good step coverage, whereas there is a drawback in that a thermal bundle is generated in a wafer due to a long time exposure of the wafer to a high temperature, resulting in a degraded electric characteristic due to a deterioration of an electric characteristic and a metal electrode of a device produced on the wafer.

On the contrary, in case of depositing a nitride film using the plasma enhanced CVD apparatus, there is an advantage in that since the nitride film is formed under a low temperature atmosphere, a generation of the thermal bundle can be minimized, whereas there is a drawback in that it is impossible to deposit the nitride film when a step is formed because a loading effect and a step coverage characteristic are not good, and a quality of the nitride film is degraded compared to the thermal CVD process due to an existence of the plasma.

Meanwhile, in forming a small contact of a large scale ingegration semiconductor device with a pattern size 0.5 μm or less, when a blanket etching process using a plasma, and the like is to be performed after a spacer is deposited, it needs a profile of a nitride film 1 with an upper region of a larger thickness compared to thickness B of the side regions or thickness C of the lower region, as shown in FIG. 1.

In this case, in the prior art, a first nitride film 2a with an entirely uniform thickness as shown in FIG. 2a is deposited using the thermal CVD apparatus having an excellent step coverage. Thereafter, a second thick nitride film 2b is deposited on a surface of the first nitride film 2a as shown in FIG. 2b by moving the wafer into the plasma enhanced CVD apparatus such that a profile is obtained in which a thickness of the upper region of the nitride film is larger compared to that of each of the side regions and the lower region.

Thus, in the prior art, there exists a problem that it has complicated processes because, in order to form the nitride film with a larger thickness at the upper region thereof compared to those of the side regions and under region, the nitride film must be formed with a uniform thickness on the entire surface of the wafer using, as a first CVD apparatus, a thermal CVD apparatus with an excellent step coverage characteristic, and then must be, in a further process, formed with a larger thickness at the upper region using, as a second CVD apparatus, another CVD apparatus (i.e., a plasma enhanced CVD apparatus with a high installation at a top region).

There is another problem that when the wafer, in which a thermal bundle is generated due to the thermal CVD process in high temperature, is moved from the thermal CVD apparatus to the plasma enhanced CVD apparatus, it is contaminated by impurities in air.

Accordingly, in the technical field of the present invention, there is a need for a method for depositing a nitride film with a different thickness for each region thereof in one CVD apparatus while further simplifying the process.

DISCLOSURE OF INVENTION

The present invention has been made to enhance the aforementioned problems, and it is an object of the present invention to provide a method for depositing a nitride film with a different thickness for each region using one CVD apparatus.

It is another object of the present invention to provide a method for depositing a nitride film that is capable of depositing a nitride film with a greater thickness at the upper region thereof compared to those of the side regions or the lower region.

It is yet another object of the present invention to provide a method for depositing a nitride film with a different thickness for each region while minimizing a generation of a thermal bundle and simplifying a process.

In accordance with one aspect of the present invention, the above and other objects can be accomplished by the provision of a method for depositing a nitride film using a chemical vapor deposition apparatus of single chamber type comprising a process chamber comprising a inlet gas line through which process gases are introduced; a shower head for spraying the introduced process gases; a heater on which a wafer is placed; and a vacuum port for discharging the process gases, the method including: a first deposition step of depositing a first nitride film by performing a first nitride film deposition process while a mixture ratio of the ammonia ($NH_3$) gas and the silane ($SiH_4$) gas, which are the process gases, injected in order to first deposit the nitride film is maintained at 100:1 or more; and a second deposition step of depositing a second nitride film on a surface of the first nitride film in-situ by maintaining the mixture ratio of the ammonia gas and the silane gas at 100:1 or less in order to secondly deposit the nitride film, after depositing the first nitride film, such that the nitride film has a higher thickness at the upper region of the nitride film compared to those of the side regions and the lower region thereof.

It is desirable that the ammonia gas is maintained in the range between about 50 and 3000 SCCM, and the silane gas is maintained in the range between about 2 and 40 SCCM. Moreover, it is desirable that a pressure in the chamber is maintained in the range between 10 and 350 torr, and a temperature in the chamber is maintained in the range between 600 and 800° C. And, it is desirable that a nitrogen ($N_2$) gas, which is a fuzzy gas for diluting the silane and ammonia gases, is maintained in the range between about 100 and 10000 SCCM.

In accordance with another aspect of the present invention, a mixture ratio of the ammonia ($NH_3$) gas and the silane ($SiH_4$) gas, which are the process gases injected in order to first deposit the nitride film, is maintained in 5:1 or more to 50:1 or less, such that the nitride film is deposited by single process with a larger thickness at the upper region of the nitride film compared to those of the side regions and lower region thereof.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

The present invention relates to an enhanced method for depositing a nitride film which is capable of depositing the nitride film with a different deposition thickness for each region thereof by adjusting a ratio of process gases in one CVD apparatus of single chamber type. Hereinafter, the present invention will be described in further detail by way of preferred embodiments thereof with reference to the accompanying drawings.

Figure 1:
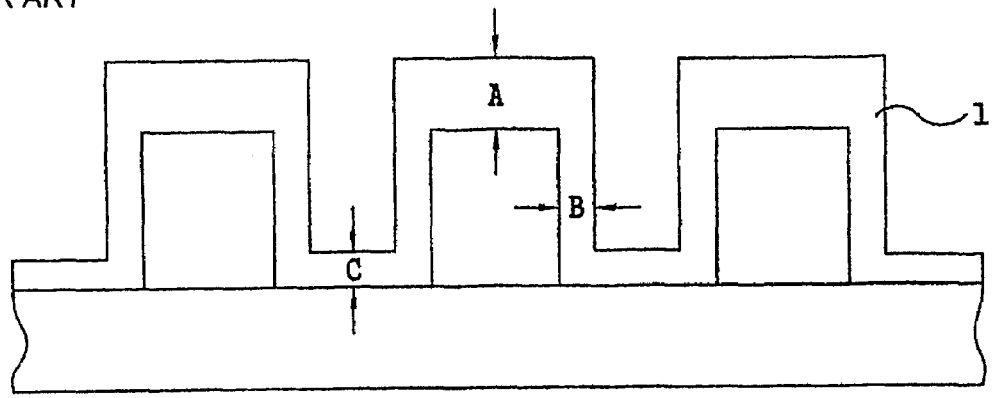
FIGS. 1 to 2b illustrate profiles of a nitride film deposited by a conventional method for nitride film deposition.
Figure 2A:
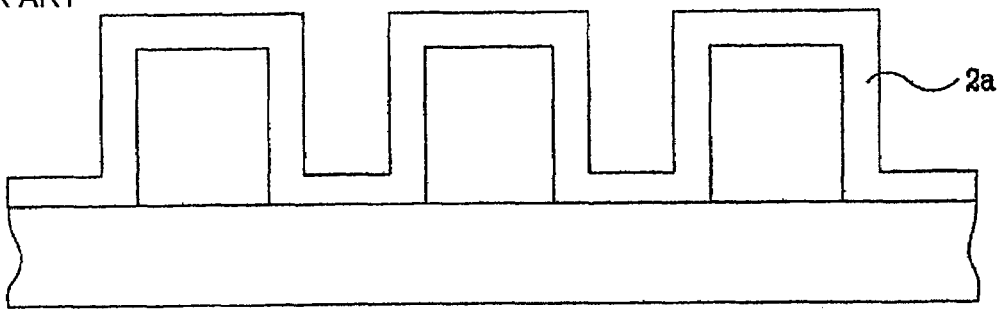
Figure 2B:
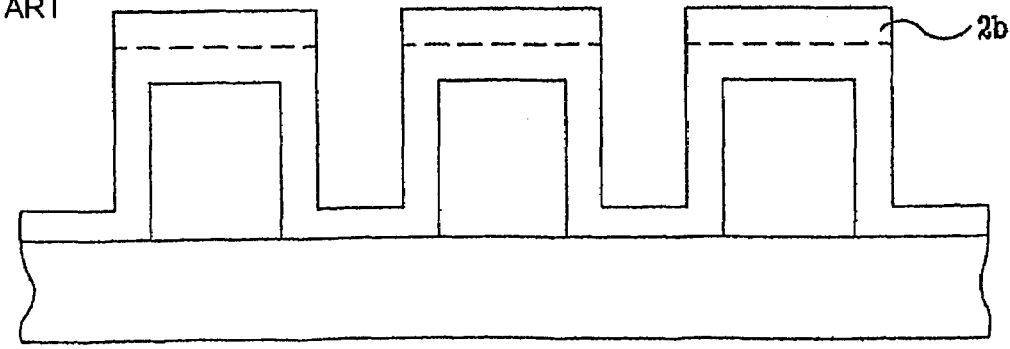
Figure 3:
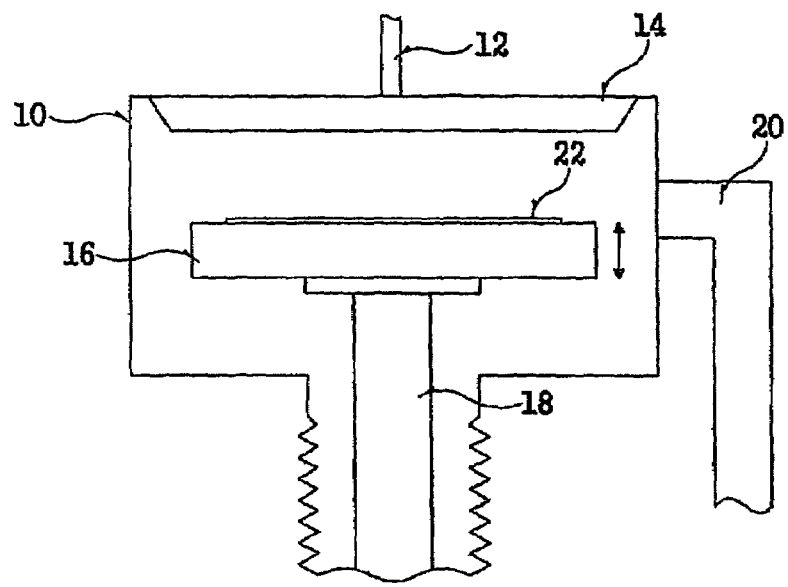
FIG. 3 is illustrates a CVD apparatus of single chamber type by which a method for depositing a nitride film according to an embodiment of the present invention is performed.

FIG. 3 illustrates a CVD apparatus of single chamber type that is applied to a method for depositing a nitride film according to an embodiment of the present invention.

Referring to FIG. 3, the CVD apparatus consists of a process chamber 10, an inlet gas line 12, a shower head 14 for spraying process gases, a ceramic heater 16 on which a wafer is loaded, a heater support 18 for supporting the heater 16, a vacuum port 20 for discharging the process gases, etc. The wafer 22 is loaded on the top of the heater 16 so that a nitride film is deposited.

In the present invention, in forming the nitride film on a surface of the wafer using the CVD apparatus of single chamber type as described above, adjustment is done as to a mixture ratio of the process gases that are injected into the process chamber 10, such that the nitride film is deposited on the surface of the wafer 22 with a different thickness for each region of the nitride film.

Figure 4:
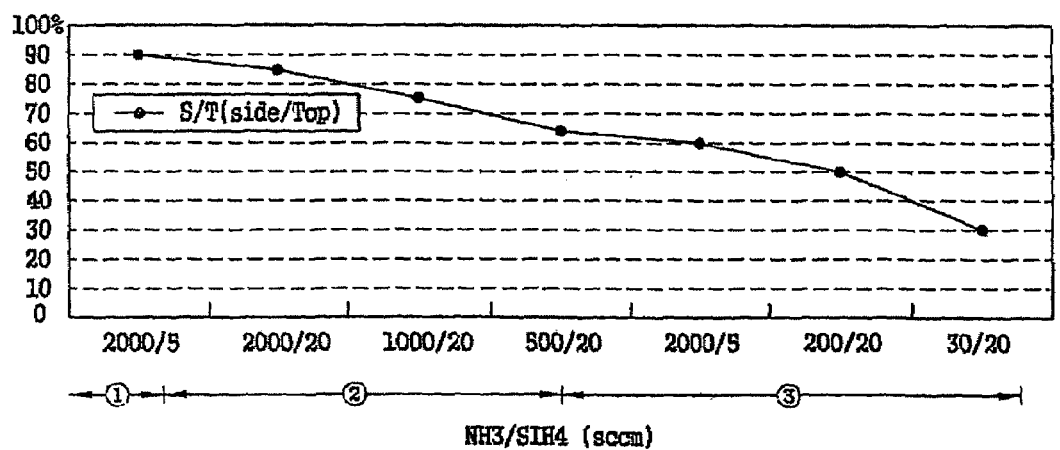
FIG. 4 is a graph illustrating a tendency of a step coverage dependent on a mixture ratio of process gases injected for nitride film deposition.

FIG. 4 is a graph showing tendency of a step coverage according to a mixture ratio of the process gases injected to deposit the nitride film.

Referring to the graph, The X-axis indicates a mixture ratio of an ammonia ($NH_3$) gas and a silane ($SiH_4$) gas, which are process gases applied to the nitride deposition, while the Y-axis indicates the step coverage tendency of the nitride film dependent on the mixture ratio of the process gases.

As seen from the graph, the step coverage characteristic is excellent, which represents a thickness ratio of the nitride film deposited on sides and top of a contact hole as the ratio of the ammonia in the process gases is relatively large, while the step coverage characteristic of the nitride film is degraded as the ratio of the ammonia in the process gases is relatively small. That is, the nitride film is deposited with a similar thickness at each of the sides and top of the contact hole as the ammonia ratio is large, whereas the nitride film is deposited with a larger thickness at the top of the contact hole compared to those of the sides thereof as the ammonia ratio is small.

Figure 5:
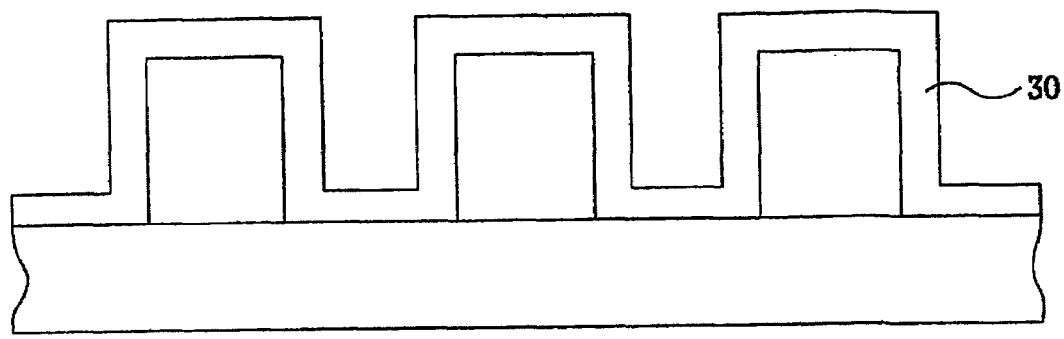
FIGS. 5 to 7 illustrate step coverage characteristics of a nitride film dependent on the mixture ratio of process gases as shown in FIG. 4.
Figure 6:
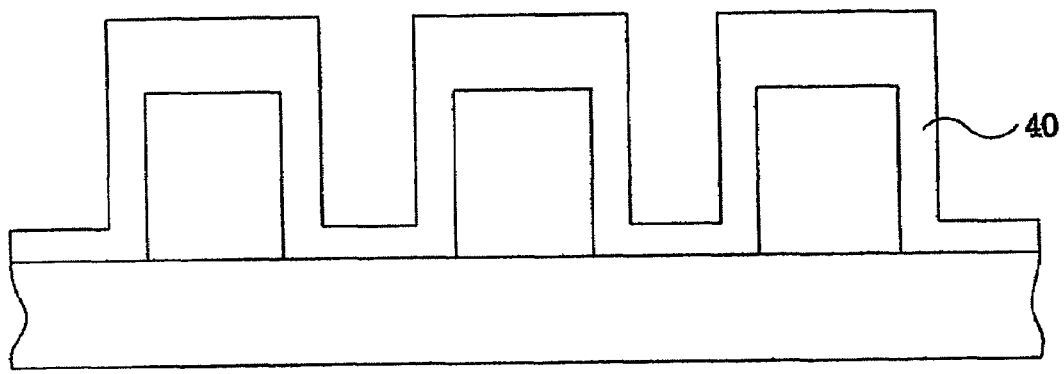
Figure 7:
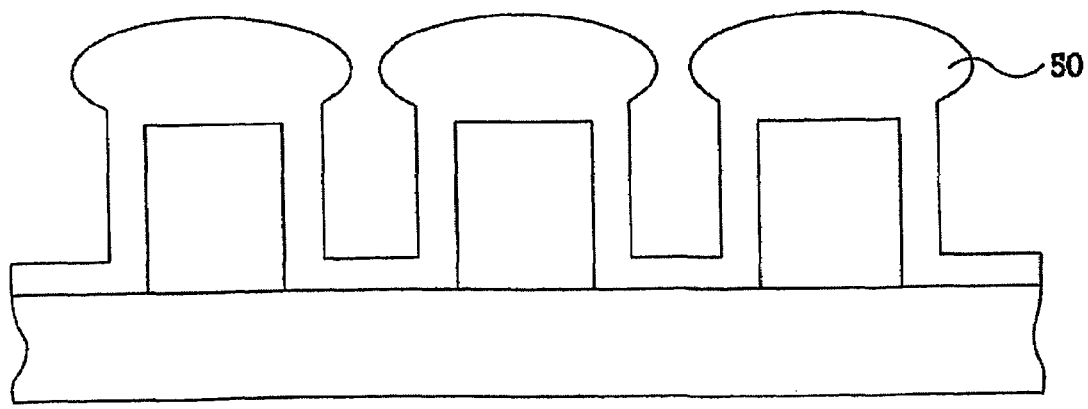

FIGS. 5 to 7 illustrate changes in a deposition thickness of the nitride film practically deposited on the wafer with the mixture ratio of the ammonia and silane gases as shown in FIG. 4.

First, FIG. 5 is a view illustrating a deposited nitride film 30 when a mixture ratio of the ammonia and the silane is about 2000:5 or more (① interval in FIG. 4). As seen from the Figure, the nitride film is deposited with a similar thickness at each of the sides and top of the contact hole.

FIG. 6 is a view illustrating a deposited nitride film 40 when the mixture ratio of the ammonia and the silane is about 500:20 or more to about 2000:5 or less (② interval in FIG. 4). As seen from the Figure, the nitride film is deposited with a greater thickness at the top of the contact hole compared to those of the sides thereof.

FIG. 7 is a view illustrating a deposited nitride film 50 when the ammonia and the silane are mixed with a mixture ratio of about 30:20 or more to about 500:20 or less (③ interval in FIG. 4). As seen from the Figure, the thickness of the nitride film at the top of the contact hole is much greater compared to those of others, which may cause an over-hang.

The method for depositing the nitride film will be herein described in connection with FIGS. 8a to 8e, which uses the fact that the thickness for each region of the nitride film is varied with the mixture ratio of the ammonia and the silane, which are the process gases. FIGS. 8a to 8e are cross-sectional process views for explaining the method for depositing the nitride film according to an embodiment of the present invention.

Figure 8A:
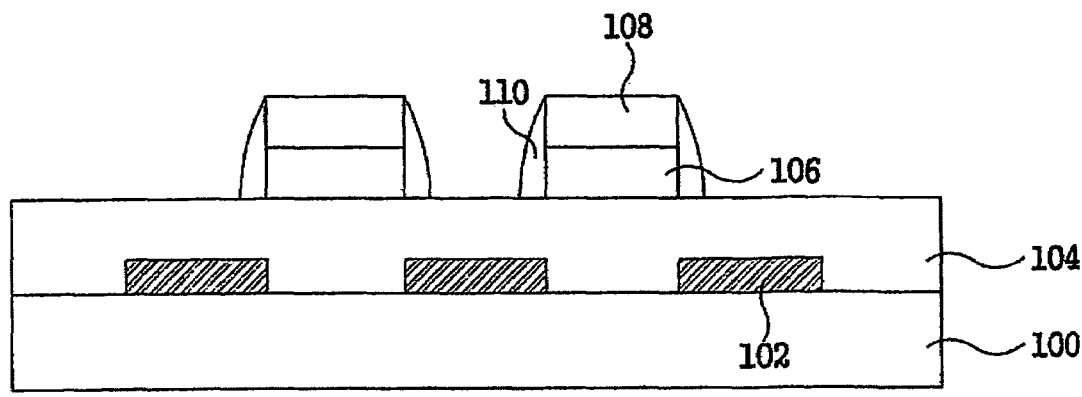
FIGS. 8a to 8e are cross-sectional views illustrating states of a wafer on which a nitride film is deposited through a preferred embodiment according to the present invention.

Referring first to FIG. 8a, a landing pad 102 is formed on the surface of the semiconductor substrate 100 in which a transistor (not shown) has been formed, and then a first interlayer isolation film 104 is coated onto the entire surface of the substrate. Thereafter, a bit line 106 made of a conductive material, such as a silicide, and a nitride film mask 108 that functions as a hard mask with respect to the bit line 106 are sequentially formed on the top of the semiconductor substrate 100 on which the landing pad 102 has been formed. Then, a nitride spacer 110 is formed at the sides of the bit line 106 and the nitride mask 108.

Figure 8B:
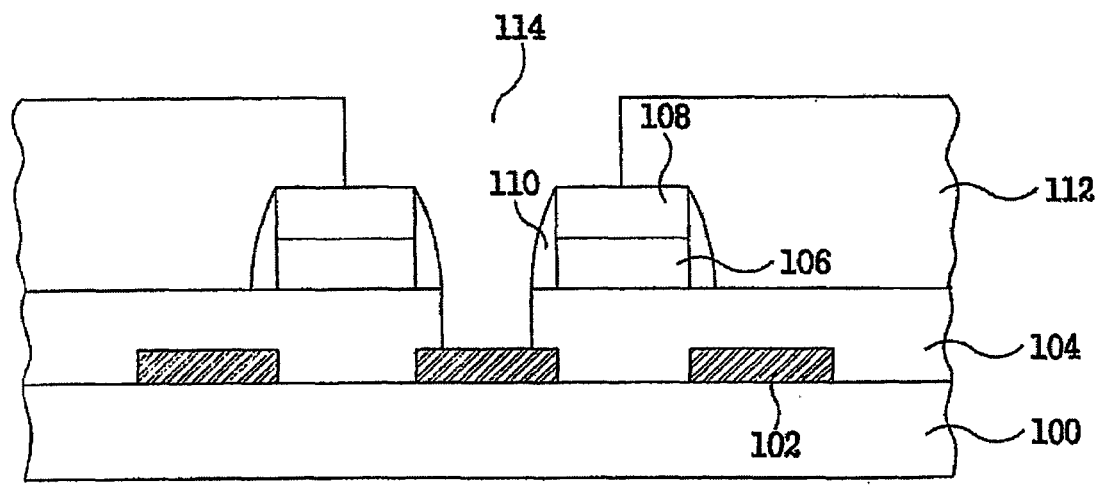

A second interlayer isolation film 112 is entirely formed on the top of the resultant object formed as above, and a contact hole 114 is formed through a typical etching process so that the surface of the landing pad 102 is exposed (refer to FIG. 8b).

Figure 8C:
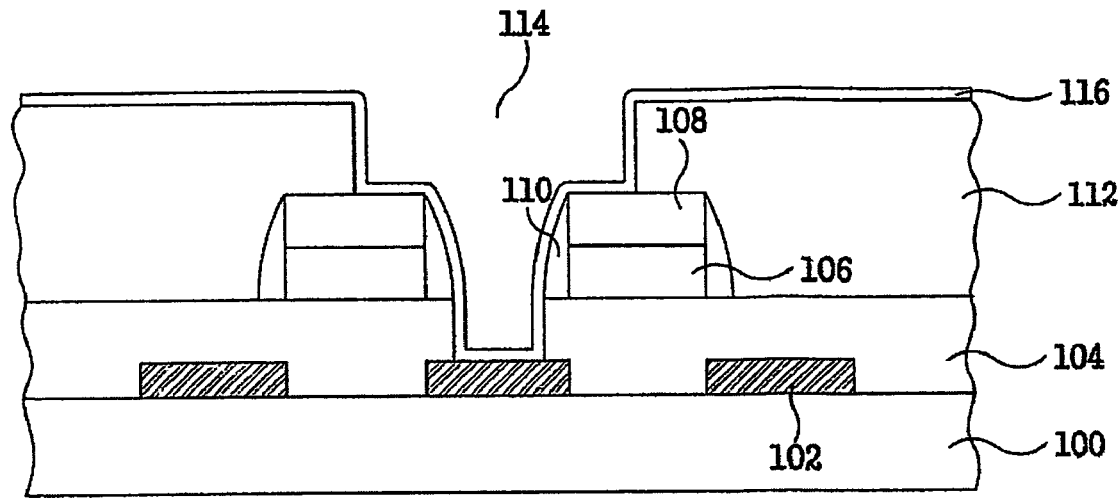
Figure 8D:
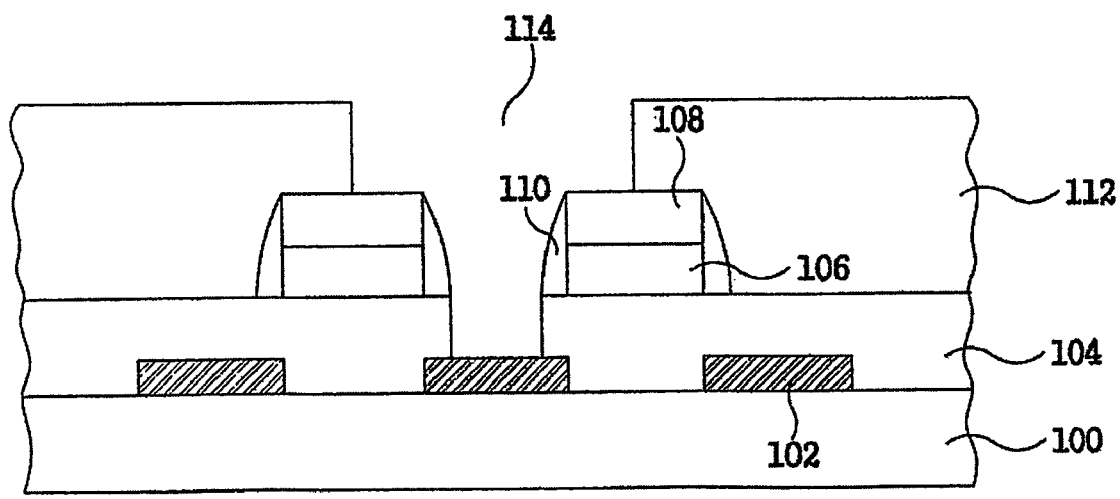

Thereafter, through the processes as shown in FIGS. 8c and 8d, the first and second nitride films are deposited so that a nitride film, which is adapted to function as an etch barrier film, is deposited on the entire surface of the semiconductor substrate 110 in which the contact hole 114 has been formed.

At this time, in performing the nitride film deposition process, the ammonia ($NH_3$) gas is maintained in the range between about 50 and about 3000 SCCM (Standard Cubic Centimeter per Minute), and the silane gas ($SiH_4$) is maintained in the range between about 2 and about 40 SCCM. Also, the nitrogen ($N_2$) gas, which is used as a fuzzy gas for diluting the silane and ammonia gases, is maintained in the range between about 100 and about 10000 SCCM, the process temperature is maintained in the range between about 600 and about 800° C., and the pressure in the chamber is maintained in the range between about 10 and about 350 torr.

Referring first to FIG. 8c, there is shown a process for depositing the first nitride film 116 adapted to function as the etch barrier film. The first nitride film 116 with an excellent step coverage characteristic is formed by depositing the first nitride film with a uniform thickness on the surface of the semiconductor substrate 100, on which the contact hole 114 has been formed, through a mixture of the ammonia and the silane at a ratio of about 100:1.

Subsequently, as shown in FIG. 8d, in order to deposit the nitride film with a larger thickness only at the top of the second interlayer isolation film 112 in which the contact hole 114 has been formed, a second nitride film process continues to be performed through in-situ in the chamber with respect to the top of the semiconductor substrate 100 on which the first nitride film 116 has been deposited.

That is, the second nitride film 118 is deposited so that the nitride film is formed with a greater thickness at the top of the second interlayer isolation film 112 compared to that of the area of the contact hole 114 by maintaining the mixture ratio of the ammonia ($NH_3$) gas and the silane ($SiH_4$) gas to be 100:1 or less, while the semiconductor substrate 100, on which the first nitride film 116 has been deposited, is loaded on the heater 16.

Thus, if the nitride film is to be formed with a larger thickness at the top of the second interlayer isolation film 112 compared to others, the process of two steps is applied for depositing the first and second nitride films 116 and 118 using respective process gases mixed in the mixture ratios of the ammonia gas and the silane gas being 100:1 or more and 100:1 or less, respectively, as shown in FIGS. 8c and 8d.

The first and second nitride films 116 and 118 deposited through the process of two steps are differentially denoted by a dotted line as shown in FIG. 8d.

Meanwhile, although not shown in the figure, in addition to the process of two steps as described above, the nitride film may be formed with a greater thickness at the top of the second interlayer isolation film 112 compared to others, even with a single process for depositing the nitride film by maintaining the mixture ratio of the ammonia gas and the silane gas to be 100:1 or less. In other words, it is possible to form the nitride film with a greater thickness at the top of the second interlayer isolation film 112 compared to the area of the contact hole 114 to be the structure as shown in FIG. 8d even with the single process.

After the top area of the second interlayer isolation film 112 is thus deposited with the nitride film of the greater thickness as compared to the area of the contact hole 114, the contact portion (i.e., a bottom portion of the contact hole 114) is opened through a dry etch so that the lower electrode 102 and the plug electrode 120 are electrically in contact to each other, as in the conventional deposition method.

Figure 8E:
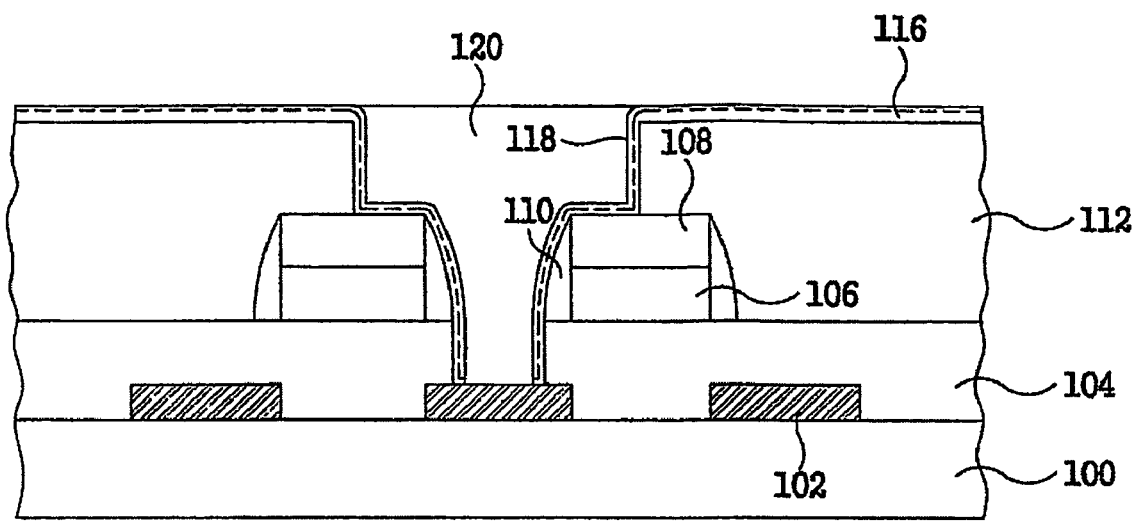

After this process, the contact hole 114 is completely filled by coating a conductive material onto the semiconductor substrate on which the nitride film has been deposited with a greater thickness at the top of the second interlayer isolation film 112 as shown in FIG. 8e. Thereafter, a plug electrode 120 contiguous to a lower landing pad is formed by carrying out a planarization process, such as a chemical mechanical polishing process or a blanket etching process. At this time, damage to the second interlayer isolation film 112 surrounding a bit line, upon the planarization process, can be prevented by the thick nitride film formed on the surface of the second interlayer isolation film.

Moreover, since the nitride film is deposited with a greater thickness only at the top of the second interlayer isolation film 112, it has essentially no effect on the aspect ratio of the contact hole, thereby forming a complete plug without generating a void.

INDUSTRIAL APPLICABILITY

In the prior art, in case that a nitride film is to be formed with a greater thickness at the top of the second interlayer isolation film compared to others, the first nitride film is first deposited using a thermal CVD apparatus having an excellent step coverage characteristic, and then the resultant substrate is moved into a plasma enhanced CVD apparatus to be subject to a process for depositing the second thick nitride film at the top of the second interlayer isolation film. Thus, there are problems that since the first nitride film is deposited and then resultant substrate is moved into another CVD apparatus, process delay and error rate increase arise and also two or more types of CVD apparatuses are needed.

However, in the present invention, the mixture ratio of the reaction gases is adjusted through one CVD apparatus of single chamber type. As a result, after the first nitride film is formed, the second nitride film can be formed in-situ in the same CVD apparatus. Accordingly, error rate during the wafer movement can be reduced and a separate CVD apparatus is not required, thereby decreasing a work space.

As described above, the present invention has advantages in that it can be carried out by simply adjusting a mixture ratio of the process gases using one chemical vapor deposition apparatus of single chamber type, and it is possible to manufacture a semiconductor device with a excellent quality, in which steps of the process are simplified and problems such as a thermal budget do not arise. Here, because one chemical vapor deposition apparatus of single chamber type is used, there is no need for a LPCVD process of high temperature, resulting in a minimized thermal budget.

What has been described is only descriptive of a method for depositing the nitride film by way of the preferred embodiments of the present invention, and the present invention is not limited to the illustrated embodiments and may cover various modifications that may be occurred by those skilled in the art, without departing from the scope and spirit of the invention as disclosed in the accompanying claims.

In other words, while the method for depositing a nitride film with a different thickness for each region thereof has been described by way of the process of forming the plug electrode contiguous to the landing pad, the present invention may be applied to other processes of making a different deposition thickness for each region.

What is claimed is:

1. A method for depositing a nitride film by chemical vapor deposition using a chemical vapor deposition apparatus of single chamber type having a process chamber comprising a inlet gas line through which process gases are introduced; a shower head for spraying the introduced process gases; a heater on which a wafer is placed; and a vacuum port for discharging the process gases, the method comprising the steps in sequence of:
   a first step of depositing a first nitride film on the lower, side and upper regions of a patterned trench formed on a wafer by performing a first nitride film deposition process using a process gas at a first mixture ratio of ammonia ($NH_3$) gas and silane ($SiH_4$) gas, in the range of 100:1 or more; and,
   a second step of depositing a second nitride film on a surface of the first nitride film in-situ by maintaining a process gas at a second mixture ratio of ammonia gas and silane gas different from the first mixture ratio and in the range of 100:1 or less in order to secondly deposit the nitride film, after depositing the first nitride film, wherein a pressure in the chamber is maintained in the range between 10 and 350 torr, whereupon the first and second nitride films deposited together have a greater thickness at the upper region as compared to the side regions and the lower region thereof.

2. The method as set forth in claim 1, wherein the ammonia gas is introduced into the process chamber at a flow rate of between about 50 and 10000 SCCM, and the silane gas is introduced into the process chamber at a flow rate of between about 2 and 40 SCCM.

3. The method as set forth in claim 1, wherein a temperature in the chamber is maintained in a range between 600 and 800° C.

4. The method as set forth in claim 1, including the step of introducing an inert gas into the process chamber at a flow rate between about 100 and 10000 SGGM to dilute the silane and ammonia gases.

5. The method as set forth in claim 4, wherein the inert gas comprises nitrogen ($N_2$) gas.

* * * * *